(12) United States Patent
Jain et al.

(10) Patent No.: US 9,160,333 B2
(45) Date of Patent: Oct. 13, 2015

(54) CAPACITIVE MICROELECTROMECHANICAL SWITCHES WITH DYNAMIC SOFT-LANDING

(75) Inventors: Ankit Jain, West Lafayette, IN (US); Muhammad Ashraful Alam, West Lafayette, IN (US); Pradeep R Nair, Maharashtra (IN)

(73) Assignee: PURDUE RESEARCH FOUNDATION, West Lafayette, IN (US)

( * ) Notice: Subject to any disclaimer, the term of this patent is extended or adjusted under 35 U.S.C. 154(b) by 276 days.

(21) Appl. No.: 13/466,006

(22) Filed: May 7, 2012

(65) Prior Publication Data

US 2012/0279846 A1 Nov. 8, 2012

Related U.S. Application Data

(60) Provisional application No. 61/483,225, filed on May 6, 2011.

(51) Int. Cl.
*H01H 51/22* (2006.01)
*H03K 17/975* (2006.01)

(52) U.S. Cl.
CPC .................................. *H03K 17/975* (2013.01)

(58) Field of Classification Search
CPC ............ H01H 59/0009; H01H 50/005; H01H 1/0036; H01H 2050/005
USPC .......................................................... 335/78
See application file for complete search history.

(56) References Cited

U.S. PATENT DOCUMENTS

| 5,160,909 | A | * | 11/1992 | Crow ............................. 335/128 |
| 6,300,854 | B1 | * | 10/2001 | Oberndorfer ................. 335/196 |
| 6,426,687 | B1 |   | 7/2002  | Osborn |
| 6,608,268 | B1 |   | 8/2003  | Goldsmith |
| 7,602,265 | B2 |   | 10/2009 | Deligianni |
| 8,238,074 | B2 | * | 8/2012  | Steeneken ...................... 361/290 |
| 8,339,764 | B2 | * | 12/2012 | Steeneken et al. ............. 361/281 |
| 2005/0099252 | A1 | * | 5/2005 | Isobe et al. ........................ 335/78 |
| 2009/0201623 | A1 | * | 8/2009 | Steeneken ...................... 361/290 |
| 2011/0079495 | A1 |   | 4/2011 | Knipe |
| 2012/0048709 | A1 | * | 3/2012 | Steeneken et al. ............ 200/600 |

OTHER PUBLICATIONS

Goldsmith, et al. "Micromechanical Membrane Switches for Microwave Applications," IEEE MTT-S Int. Microwave Symposium, 1995, Dig. 1, pp. 91-94.
De Los Santos, et al. "RF MEMS for Ubiquitous Wireless Connectivity: Part 2- Application," IEEE Microwave Magazine, Dec. 2004, vol. 5, No. 4; pp. 50-65.

(Continued)

*Primary Examiner* — Alexander Talpalatski
(74) *Attorney, Agent, or Firm* — Purdue Research Foundation

(57) ABSTRACT

A microelectromechanical system (MEMS)-based electrical switch. The electrical switch includes a moveable electrode, a dielectric layer positioned adjacent the moveable electrode on a first side of the dielectric layer and spaced apart from the moveable electrode when the moveable electrode is in an inactivated position and in contact with the moveable electrode when the moveable electrode is in an activated position, and a substrate attached to the dielectric layer on a second side opposite to the first side, the moveable electrode is configured to brake prior to coming in contact with the dielectric layer when the moveable electrode is switched between the inactivated state and the activated state.

10 Claims, 10 Drawing Sheets

(56) References Cited

OTHER PUBLICATIONS

Rebeiz, et al. "RF MEMS Switches and Switch Circuits," IEEE Microwave Magazine, Dec. 2001, vol. 2, No. 4; pp. 59-71.

Papaioannou, et al. "Dielectric Charging in Radio Frequency Microelectromechanical System Capacitive Switches: A Study of Material Properties and Device Performance," Applied Physics Letters, 2007, vol. 90, pp. 233507-1-233507-3.

Gregori, et al. "Mechanical Creep as a Life-limiting Factor of Radio Frequency Microswitches," Applied Physics Letters, 2005, vol. 87, pp. 154101-1-154101-3.

Xu, et al. "Pull-in/out Analysis of Nano/Microelectromechanical Switches with Defective Oxide Layers," Applied Physics Letters, 2009, vol. 95, pp. 073112-1-073112-3.

Philippine, et al. "Evolution of Interfacial Adhesion Force in Dynamic Micromachines Due to Repetitive Impact Loading," Applied Physics Letters, 2007, vol. 91, pp. 063102-1-063102-3.

Komvopoulous, "Surface Engineering and Microtribology for Microelectromechanical Systems," Wear, Dec. 1996, vol. 200, No. 1-2; pp. 305-327.

Pippard, "Response and Stability," Cambridge University Press, Cambridge, 1985, pp. 134-141.

Borovic, et al. "Open-Loop Versus Closed- Loop Control of MEMS Devices: Choices and Issues," Journal of Micromechanics and Microengineering, 2005, vol. 15, No. 10; pp. 1917-1924.

Sumali, et al. "Waveform Design for Pulse-and-hold Electrostatic Actuation in MEMS," Sensors and Actuators A, 2007, vol. 134, pp. 213-220.

Allen, et al. "Input and Design Optimization Under Uncertainty to Minimize the Impact Velocity of an Electrostatically Actuated MEMS Switch," Journal of Vibration and Acoustics, Apr. 2008, vol. 130, pp. 021009-1-021009-9.

Blecke, et al. "A Simple Learning Control to Eliminate RF-MEMS Switch Bounce," Journal of Microelectromechanical Systems, Apr. 2009, vol. 18, No. 2; pp. 458-465.

Nathanson, et al. "The Resonant Gate Transistor," IEEE Transactions on Electron Devices, Mar. 1967, vol. 14, No. 3; pp. 117-133.

Czaplewski, et al. "A Soft-Landing Waveform for actuation of a Single-Pole Single-Throw Ohmic RF MEMS Switch," Journal of Microelectromechanical Systems, Dec. 2006, vol. 15; No. 6; pp. 1586-1594.

Castaner, et al. "Pull-in Time-energy Product of Electrostatic Actuators: Comparison of Experiments with Stimulation," Sensors and Actuators A, 2000, vol. 83, No. 1-3; pp. 263-269.

Li, et al. "Bottom-up Assembly of Large-Area Nanowire Resonator Arrays," Nature Nanotechnology, Feb. 2008, vol. 3, pp. 88-92.

Packard, et al. "Contact-Printed Microelectromechanical Systems," Advanced Materials, 2010, vol. 22, No. 16; pp. 1840-1844.

Lee, et al. "Fabricating Nanowire Devices on Diverse Substrates by Simple Transfer-printing Methods," PNAS, Jun. 2010, vol. 107, No. 22; pp. 9950-9955.

Kim, et al. "A Multiaxial Stretchable Interconnect using Liquid-Alloy-Filled Elastomeric Microchannels," Applied Physics Letters, 2008, vol. 92, pp. 011904-1-011904-3.

Steeneken, et al. "Dynamics and Squeeze Film Gas Damping of a Capacitive RF MEMS Switch," Journal of Micromechanics and Microengineering, 2005, vol. 15, No. 1; pp. 176-184.

Kam, et al. "A New Nano-Electro-Mechanical Field Effect Transistor (NEMFET) Design for Low-Power Electronics," IEEE, International Electronic Devices Meeting, 2005, pp. 463-466.

Akarvardar, et al. "Design Considerations for Complementary Nanoelectromechanical Logic Gates," IEEE, International Electronic Devices Meeting, 2007, pp. 299-302.

Sumali et al. "Structural Dynamics of an RF MEMS Switch," 2005 ASME International Mechanical Engineering Congress and Exposition, Nov. 2005, pp. 1-5.

Leus et al. "Optimizing the Dynamic Response of RF MEMS Switches using Tailored Voltage Pulses," Thermal, Mechanical and Multi-Physics Simulation Experiments in Microelectronics and Micro-Systems, 2007, pp. 1-4.

Yao, "RF MEMS from a device perspective," Journal Micromechanics and Microengineering, 2000, vol. 10, pp. R9-R38.

\* cited by examiner

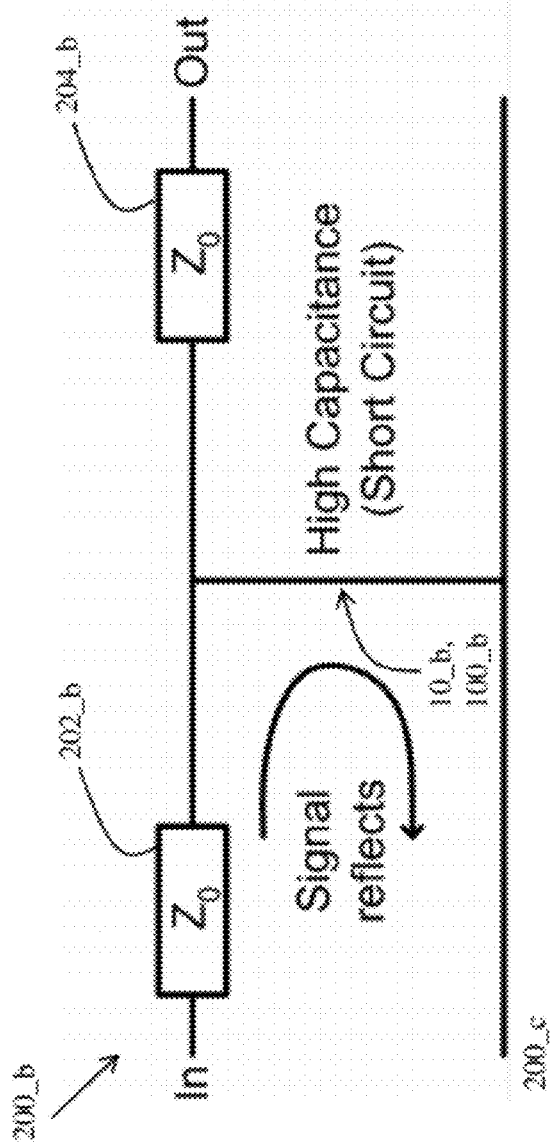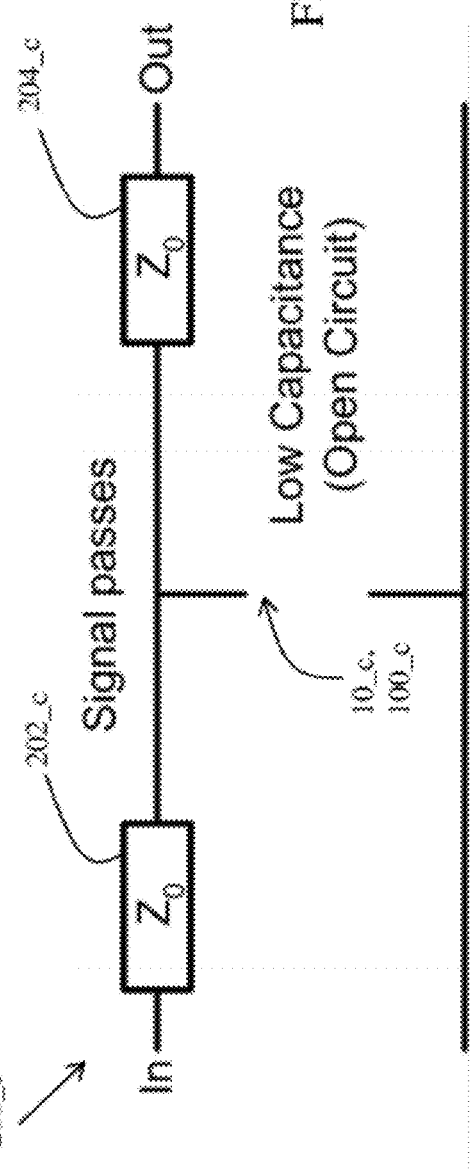
FIG. 2(b)
FIG. 2(c)

CAPACITIVE MICROELECTROMECHANICAL SWITCHES WITH DYNAMIC SOFT-LANDING

This invention was made with government support under DE-FC52-08NA28617 awarded by the Department of Energy. The government has certain rights in the invention.

PRIORITY

The present U.S. patent application is related to and claims the priority benefit of U.S. Provisional Patent Application Ser. No. 61/483,225, filed May 6, 2011, the contents of which is hereby incorporated by reference in its entirety into this disclosure.

TECHNICAL FIELD

This invention relates to capacitive microelectromechanical switches, and particularly to the problem of electromechanical dielectric degradation associated with the hard landing of a movable electrode.

BACKGROUND

Radio frequency-microelectromechanical systems (RF-MEMS) capacitive switch (CS) based systems have attracted a significant interest in recent years. These RF-MEMS CS systems provide excellent RF characteristics (such as high linearity and low losses), as well as low power consumption. A typical RF-MEMS CS system 10 found in the prior art is depicted in FIG. 10. Such an RF-MEMS CS may find diverse applications in radar systems, wireless communication, instrumentation, etc. Compared to solid state switches, RF-MEMS switches offer the advantages of low power consumption, low insertion and return loss, extremely high linearity, and excellent isolation. Several disadvantages have been well documented in the prior art including but not limited to reaching and maintain a high level of reliability. One source of degradation of RF-MEMS CSs is the result of dielectric charging by virtue of a built-in charge that causes a shift in the capacitance-voltage characteristics. Additionally, poor reliability related to mechanical creep, and fatigue amongst other issues, continue to hinder the large scale deployment of RF-MEMS switches. Another key reliability concern is the impact velocity—the velocity with which a movable electrode 12 (see FIG. 10) impacts a dielectric layer 14 in an electrostatically actuated (voltage source 16) RF-MEMS CS. This impact damages the dielectric layer 14 and increases the adhesion forces which may eventually lead to malfunction of the switch due to stiction.

To address the challenges in reliability of a CS, novel approaches are needed to address the above-described dielectric degradation caused by impacting of a moveable electrode against a dielectric layer.

SUMMARY

The present disclosure provides a microelectromechanical system (MEMS)-based electrical switch system. The electrical switch system includes at least one electrical switch. The switch includes a moveable electrode. The switch further includes a dielectric layer positioned adjacent the moveable electrode on a first side of the dielectric layer and spaced apart from the moveable electrode when the switch is in an inactivated position and in contact with the moveable electrode when the switch is in an activated position. The switch also includes a substrate attached to the dielectric layer on a second side opposite to the first side. The system also includes at least one voltage source coupled to the switch. The electrical switch system further includes at least one resistive element positioned in series between the switch and the voltage source. The resistive element is configured to brake movement of the moveable electrode prior to coming in contact with the dielectric layer when the voltage source causes the switch to be switched between the inactivated state and the activated state.

The present disclosure also provides a microelectromechanical system (MEMS)-based electrical switch. The electrical switch includes a moveable electrode, and a dielectric layer positioned adjacent the moveable electrode on a first side of the dielectric layer and spaced apart from the moveable electrode when the moveable electrode is in an inactivated position and in contact with the moveable electrode when the moveable electrode is in an activated position. The electrical switch also includes a substrate attached to the dielectric layer on a second side opposite to the first side, the moveable electrode is configured to brake movement of the moveable electrode prior to coming in contact with the dielectric layer when the moveable electrode is switched between the inactivated state and the activated state.

BRIEF DESCRIPTION OF DRAWINGS

FIGS. 2($b$) and 2($c$) are capacitive loading schematic of the input and output RF transmission lines using the typical RF-MEMS CS depicted in FIG. 2($a$), in a high capacitance (short circuit) configuration, FIG. 2($b$), and in a low capacitance (open circuit) configuration, FIG. 2($c$).

FIG. 5($b$) is a graph of Displacement (y), as designated in the graph, and velocity (v) as a function of time (t), as designated in the graph, during the activation cycle showing pull-in time ($t_{PI}$) and impact velocity ($v_{impact}$), in a typical RF-MEMS CS.

DETAILED DESCRIPTION

Figure 1:
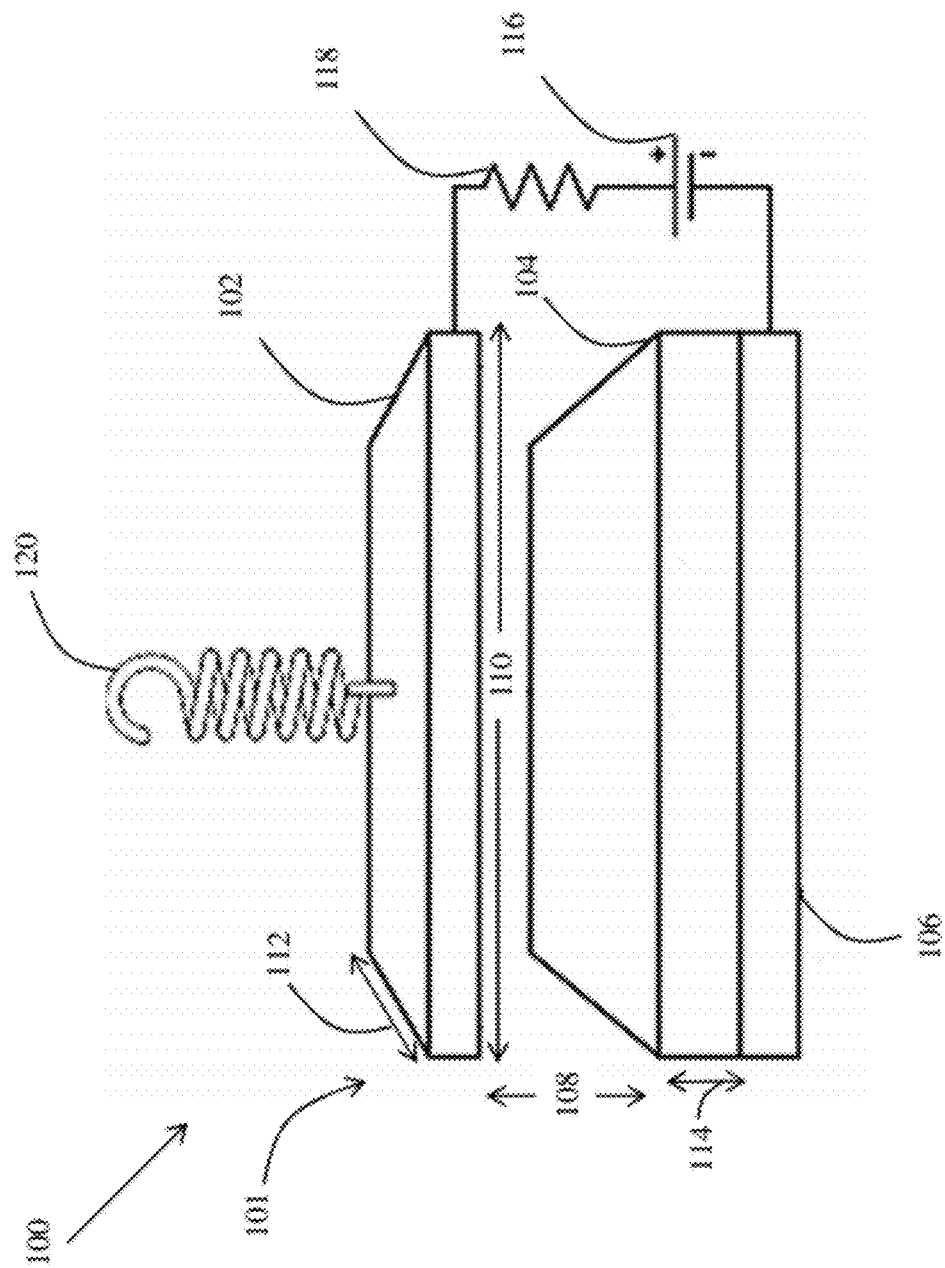
FIG. 1 is a schematic of a typical radio frequency-microelectromechanical system (RF-MEMS) capacitive switch (CS) based system, driven with a novel approach, according to the present disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

Novel radio frequency-microelectromechanical systems (RF-MEMS) capacitive switching arrangements are described. In accordance with the present disclosure, various approaches are described to provide resistive and capacitive braking that can reduce impact velocity of a movable electrode in an RF-MEMS CS significantly without compromising other performance characteristics such as pull-in voltage and pull-in time of the moveable electrode. Resistive braking is achieved by inserting a resistance in series with the voltage source. Capacitive braking is achieved by patterning of the electrode or the dielectric in the RF-MEMS CS.

Referring to FIG. 1, an RF-MEMS CS system 100, according to the present disclosure, is depicted. The system includes an RF-MEMS CS device 101, a voltage source 116, a resistor 118, and a return mechanism depicted as a spring 120 (which is configured to provide a restoring force in opposite direction to an electrostatic force that can deflect the moveable electrode 102, see below, downward). The device 101 is coupled to the voltage source 116 and the resistor 118. It is appreciated that the voltage source 116 can be a switched supply (i.e., on and off) or a linear supply (i.e., capable of providing voltages according to a predetermined range). It is also appreciated that the resistor 118 is intended to represent an impedance (i.e., including a real component and an imaginary component).

The device 101 is defined by a moveable electrode 102, a dielectric layer 104, and a substrate 106. The moveable electrode 102 and the dielectric layer 104 are separated by a gap, e.g., an airgap, represented by the double arrow 108. The device is depicted in an inactivated state; therefore the gap 108 is the largest. The moveable electrode 102 is defined by a length 110 and a width 112. Similarly, the dielectric layer 104 is defined by the length 110 and the width 112, although other variations are also possible. The dielectric layer 104 is also defined by a thickness of 114.

Figure 2A:
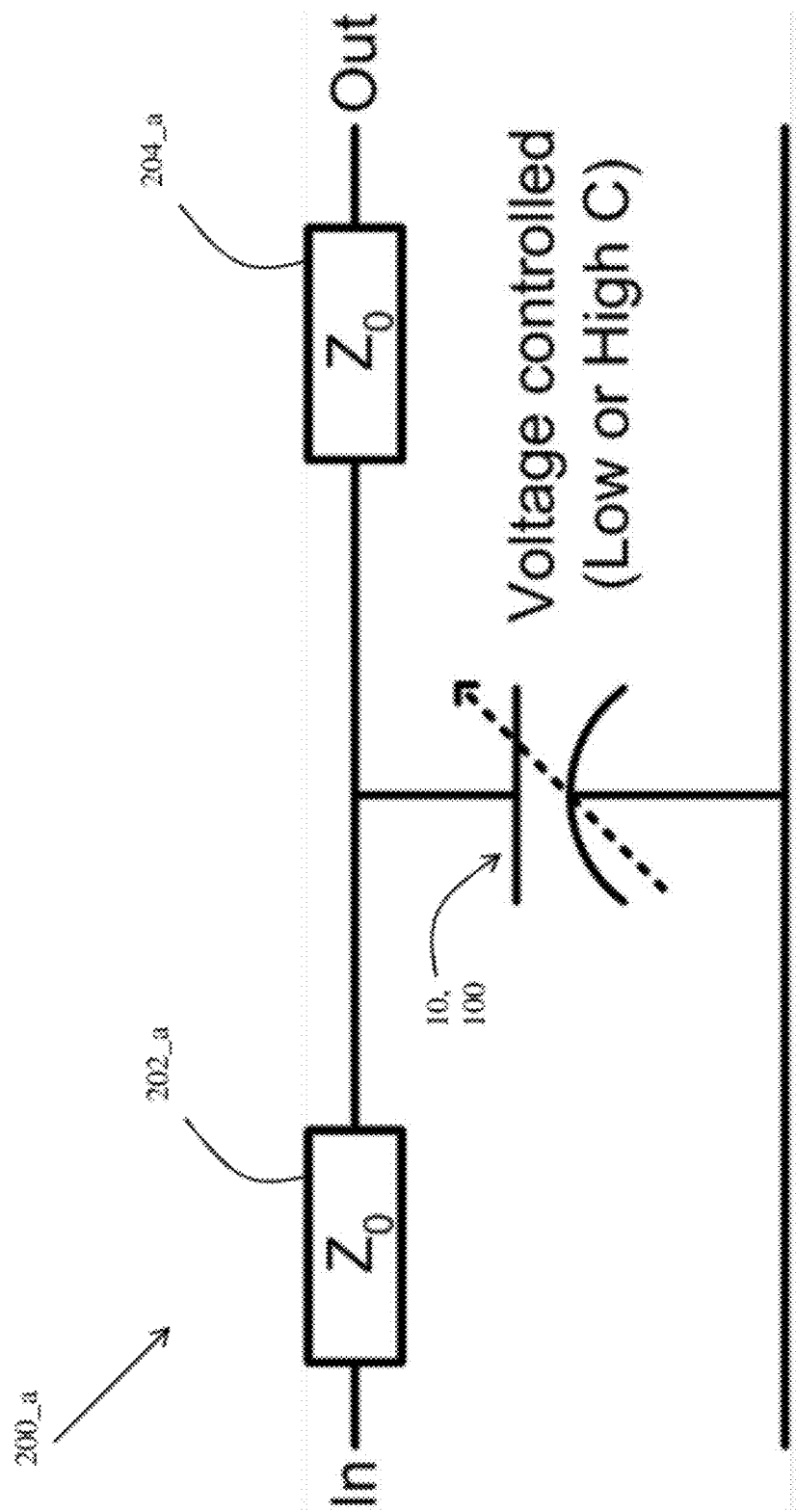
FIG. 2($a$) is a capacitive loading schematic of the input and output RF transmission lines using a typical RF-MEMS CS.
Figure 10:
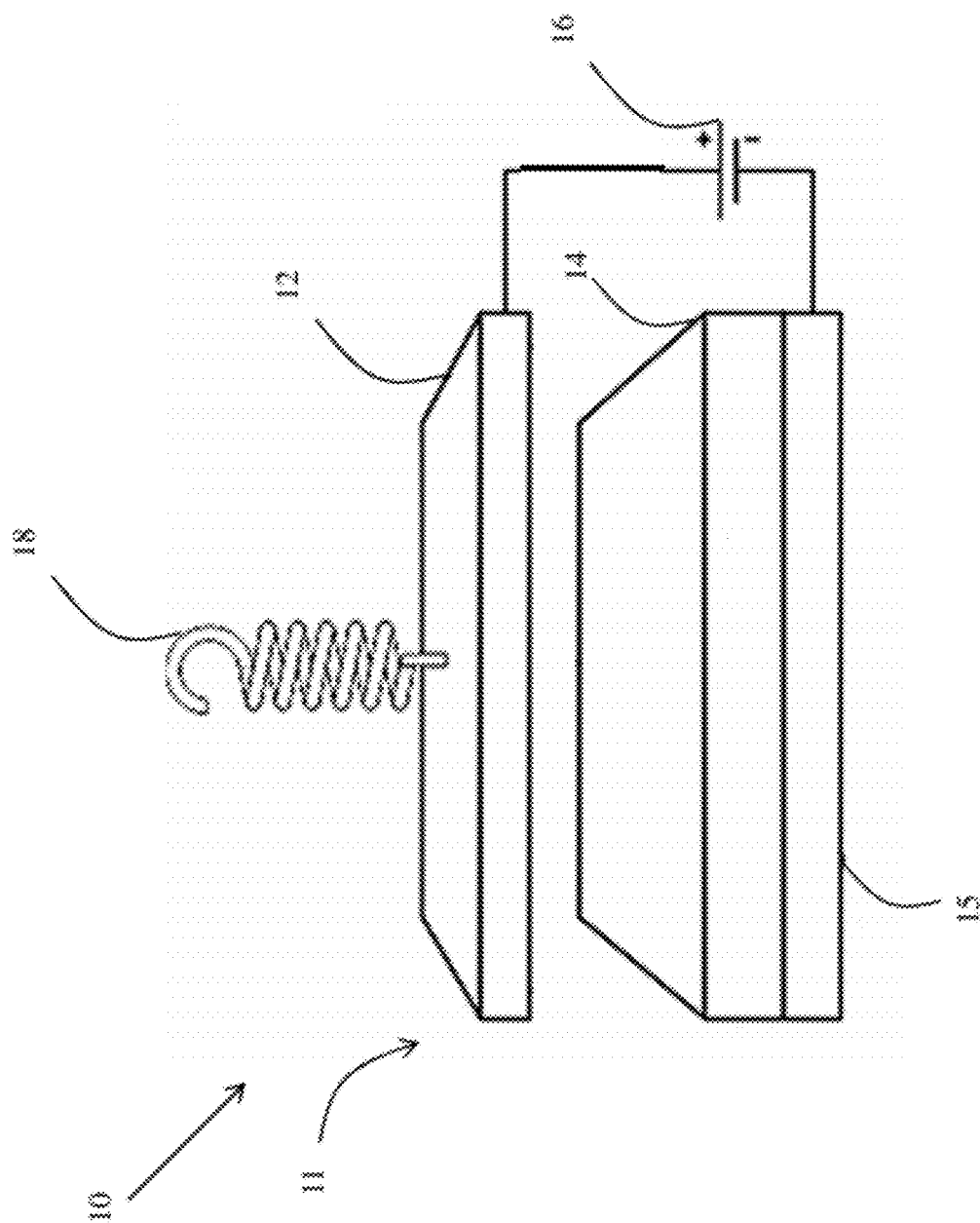
FIG. 10 is a schematic of a typical RF-MEMS CS, found in the prior art.

Referring to FIG. 2($a$), a model 200_$a$ for an RF-MEMS CS system is depicted (whether a typical, i.e., without braking as in the RF-MEMS CS systems of prior art, or with braking, i.e., based on the arrangements described herein), is depicted. Incoming RF signal identified as "In" sees an input impedance $Z_0$ 202_$a$. The output RF signal also sees an output impedance $Z_0$ 204_$a$. While, these input and output impedances 202_$a$ and 204_$a$ need not be the same, for sake of simplicity these are identified as being the same. In addition, the RF-MEMS CS system 10 or 100 (see FIG. 10 and FIG. 1) is positioned between the input and output impedances 202_$a$ and 204_$a$. The RF-MEMS CS systems 10 or 100 utilize a corresponding RF-MEMS CS device 11 or 101, respectively, to provide a low or high capacitance.

Referring to FIG. 2($b$), a model 200_$b$ for an RF-MEMS CS system is depicted (whether a typical, i.e., without braking as in the RF-MEMS CS systems of prior art, or with braking, i.e., based on the arrangements described herein), is depicted. Incoming RF signal identified as "In" sees an input impedance $Z_0$ 202_$b$. The output RF signal also sees an output impedance $Z_0$ 204_$b$. While, these input and output impedances 202_$b$ and 204_$b$ need not be the same, for sake of simplicity these are identified as being the same. In addition, the RF-MEMS CS system 10 or 100 (see FIG. 10 and FIG. 1) is positioned between the input and output impedances 202_$b$ and 204_$b$. The RF-MEMS CS systems 10_$b$ or 100_$b$ utilize a corresponding RF-MEMS CS device 11 or 101 in an activated state (i.e., with sources 16 or 116 activated), respectively, to provide a high capacitance. The high capacitance results in a short circuit on the input side, causing the input signal to be substantially reflected. Such a reflection is similar to an electronic switch that is placed in line with the input signal being placed in an open position. Therefore, no or very little of the input signal is transmitted.

Referring to FIG. 2($c$), a model 200_$c$ for an RF-MEMS CS system is depicted (whether a typical, i.e., without braking as in the RF-MEMS CS systems of prior art, or with braking, i.e., based on the arrangements described herein), is depicted. Incoming RF signal identified as "In" sees an input impedance $Z_0$ 202_$c$. The output RF signal also sees an output impedance $Z_0$ 204_$c$. While, these input and output impedances 202_$c$ and 204_$c$ need not be the same, for sake of simplicity these are identified as being the same. In addition, the RF-MEMS CS system 10 or 100 (see FIG. 10 and FIG. 1) is positioned between the input and output impedances 202_$c$ and 204_$c$. The RF-MEMS CS systems 10_$c$ or 100_$c$ utilize a corresponding RF-MEMS CS device 11 or 101 in an inactivated state (i.e., with sources 16 or 116 inactivated), respectively, to provide a low capacitance. The low capacitance results in an open circuit on the input side, causing the input signal to be substantially transmitted. Such a transmission is similar to an electronic switch that is placed in line with the input signal and being placed in a closed position. Therefore, substantially the entire input signal is transmitted.

Two arrangements are described herein to reduce $v_{impact}$ during pull-in transient of the switch. The first arrangement (resistive braking) which is based on the idea that part of $E_d$ is remotely dissipated in the resistor 118 (see FIG. 1) away from the moveable electrode 102 and the dielectric layer 104 interface. The second arrangement (capacitive braking) includes patterning of the moveable electrode 102 or the substrate 106 and/or the dielectric layer 104 in such a way that the effective capacitor area decreases dynamically as the moveable electrode 102 approaches the dielectric layer 104. In a third approach both resistive and capacitive braking can be employed. Both the methods reduce $v_{impact}$, without compromising $V_{PI}$ and $t_{PI}$ significantly. Theory of operation of each approach, i.e., first a typical RF-MEMS CS without any braking arrangement (see FIG. 10), next the approaches according to the present disclosure (see, e.g., FIG. 1) are described.

Typical RM MEMS CS—No Braking

In the absence of a braking mechanism (i.e., resistive braking, e.g., by the resistor 118 or a capacitive braking, described further below) when the voltage source 116 is activated the moveable electrode 102 accelerates toward the dielectric layer 104 with its velocity increasing until it makes contact with the dielectric layer 104 at a maximum velocity of $v_{impact}$. By using the resistor 118, the moveable electrode 102 lands on the dielectric layer 104 softly (i.e., with lower $v_{impact}$) without compromising other critical parameters such as pull in time $t_{PI}$ and pull in voltage $V_{PI}$.

Figure 5B:
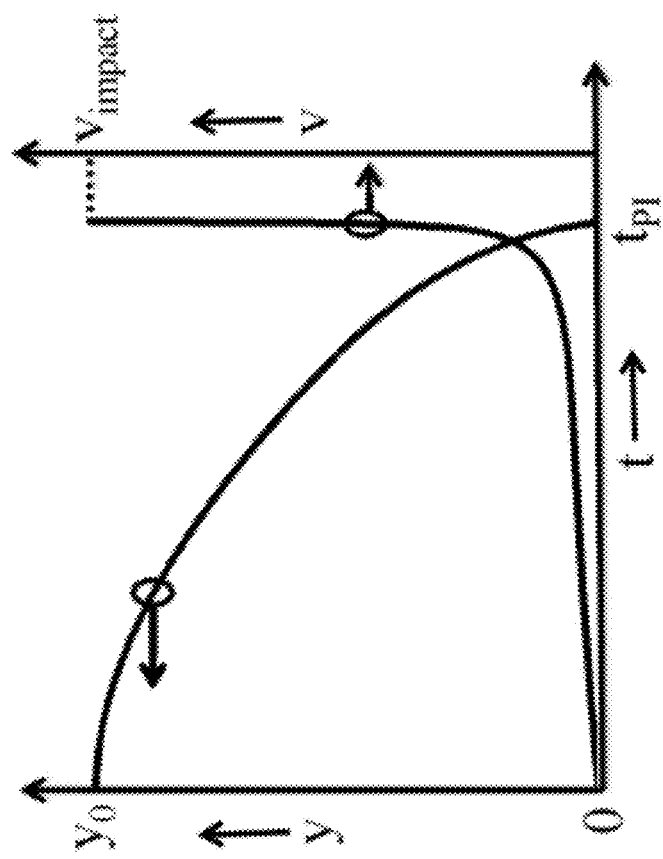
FIG. 5($a$) is a graph of Energy (E) vs. displacement (y) profile for $V<V_{PI}$ (bottom curve) and $V>V_{PI}$ (top curve), wherein $E_d$ is the energy dissipation at a top electrode-dielectric interface during an activation cycle, in a typical RF-MEMS CS.
Figure 5A:
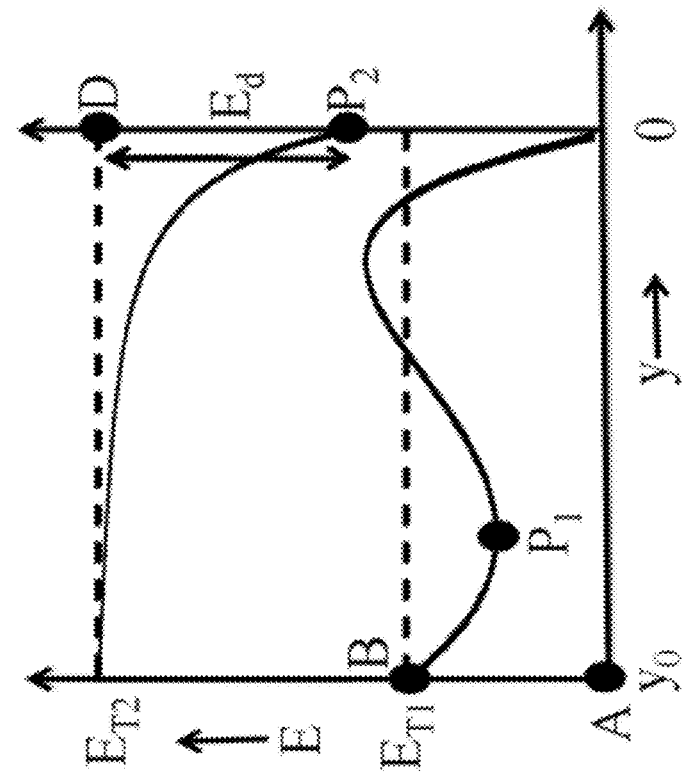

The pull-in of the device 11 (see FIG. 10) is achieved by applying a step potential V between the moveable electrode 12 and the substrate 15. Assuming the moving electrode 12 is at rest at the position depicted in FIG. 10, without employing the novel resistive braking represented by the resistor 118 in FIG. 1, a step voltage of $V<V_{PI}$ imparts an energy governed by $E_{T1}=\frac{1}{2}C(y_0)V^2$ to the device 101,
wherein $E_{T1}$ is the imparted energy,
C is the capacitance,
$y_0$ is the gap between the moveable electrode 12 and the dielectric layer 14, and
V is the voltage applied by the source 16. A graph of the energy (i.e., $E_{T1}$) vs. displacement in the vertical direction (designated as y) is depicted in FIG. 5(a). The moveable electrode 12 eventually comes to rest at a minima (point $P_1$, identified in FIG. 5(a) based on the total potential energy (E) landscape which is defined by the sum of electrostatic $$\left(\frac{1}{2}C(y)V_c^2, V_c \text{ being the voltage across the capacitor}\right)$$

and spring 18

$$\left(\frac{1}{2}k(y_0-y)^2\right)$$

potential energies (bottom curve in FIG. 5(a)). For step voltage $V>V_{PI}$, and again without employing the resistive braking, the energy imparted to the device and particularly to the moveable electrode 12 jumps to $E_{T2}$. Since the energy landscape (top graph in FIG. 5(a)) does not have any minima, i.e., a limiting point instability, results in uninhibited acceleration of the moveable electrode 12 that is eventually brought to hard-stop at y=0 (point $P_2$ in FIG. 5(a) by slamming against the immovable dielectric layer 14. It is this kinetic energy dissipation $$(E_d=\frac{1}{2}mv_{impact}^2,$$

FIG. 5(a), from point D to $P_2$) at the moveable electrode 12 and the dielectric layer 14 interface that results in damages to the dielectric. FIG. 5(b) shows the displacement (y) and velocity (v) of the moveable electrode 12 as a function of time (t) during the pull-in phase, i.e., the activation cycle.

Various open and closed loop control techniques have been employed in the prior art to reduce $v_{impact}$ or $E_d$ for individual and ensemble of MEMS switches. These techniques craft the input waveform so that v(t) is reduced below $V_{PI}$ V as the moveable electrode approaches the dielectric, thereby ensuring softer landing. Recently an innovative self-learning control algorithm was proposed to minimize the impact velocity and contact bounce by correcting the V(t) waveform iteratively. These external circuits add to the cost and the waveform developed for a nominal switch is often not optimal for an ensemble of switches (due to process variations) and the worst-case design inevitably compromise global performance.

RF-MEMS CS with Braking

The dynamics of the switch shown in FIG. 1 is modeled by coupling a simple spring-mass system with a parallel plate capacitor having a movable electrode. The governing equations for the MEMS CS are $$\text{Velocity: } v = \frac{dy}{dt} \quad (1)$$

$$\text{Acceleration: } m\frac{dv}{dt} = k(y_o-y) - \frac{1}{2}\frac{d(CV_c^2)}{dy} \quad (2)$$

$$\text{Kirchhoff's law: } I = \frac{d(CV_c)}{dt}; V = IR + V_c \quad (3)$$

where, m is the mass of the upper electrode,
k is the spring constant,
C is the capacitance of the MEMS switch,
$v_c$ is the voltage across the capacitor, and
I is the transient current flowing through the capacitor. For conventional parallel plate geometry, $A/C=y_d/E_d+y/E_0$, the series capacitance of the dielectric layer 104 and the air gap 108 (A is the electrode area). Eqs. (1)-(3), can be solved numerically.

Equation (2) indicates that the acceleration of the moveable electrode 102 is directly proportional to the electrostatic force which is given by Eq. (4)

$$F_{elec} = \frac{1}{2}\frac{d(CV_c^2)}{dy} = \frac{1}{2}\frac{V_c^2 d(C)}{dy} + \frac{1}{2}\frac{Cd(V_c^2)}{dy} \quad (4)$$

As moveable electrode 102 approaches the dielectric layer 104, $v_{impact}$ can be dynamically reduced by modulating $V_c$ or C such that either the point D or $P_2$ in FIG. 5(a) move in a way to reduce $E_d$ and $v_{impact}$.

Resistive Braking

Figure 3:
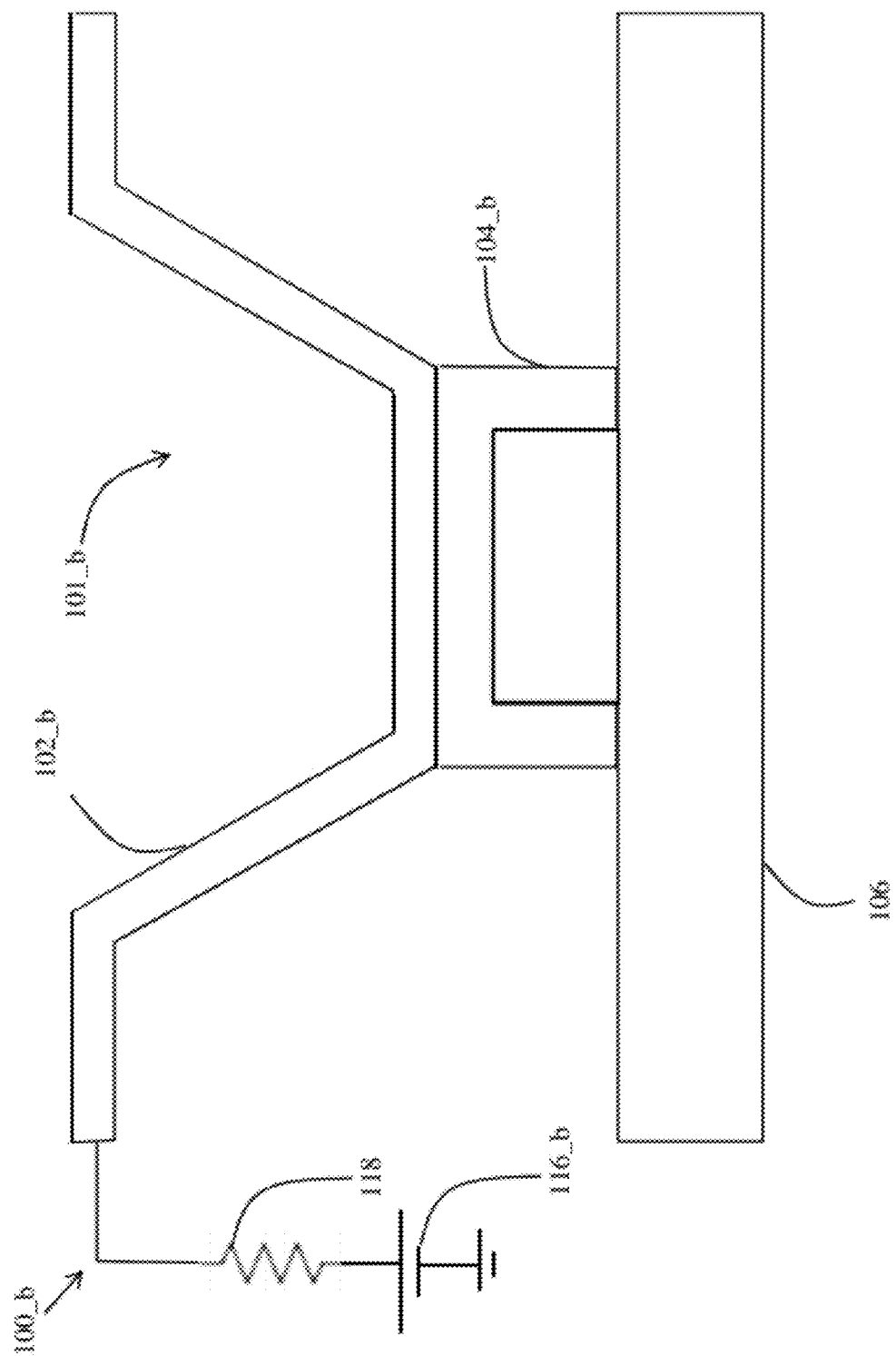
FIG. 3 is a schematic view of a typical RF-MEMS CS driven with a novel approach, according to the present disclosure, depicted in an activated state.

Referring to FIG. 3, a schematic view of the RF-MEMS CS system 100_b, according to the present disclosure using a resistive braking arrangement is depicted. The system 100_b includes an RF-MEMS CS device 101_b, a voltage source 116_b, and a resistor 118. The device 101_b is coupled to the voltage source 116_b and the resistor 118. It is appreciated that the voltage source 116_b can be a switched supply (i.e., capable of providing discrete output voltages) or a linear supply (i.e., capable of providing voltages according to a predetermined range). It is also appreciated that the resistor 118 is intended to represent an impedance (i.e., including a real component and an imaginary component).

The device 101_b is defined by a moveable electrode 102_b, a dielectric layer 104_b, and the substrate 106. The moveable electrode 102_b and the dielectric layer 104_b are depicted in contact with one and other. The device 101_b is depicted in an activated state.

Figure 4:
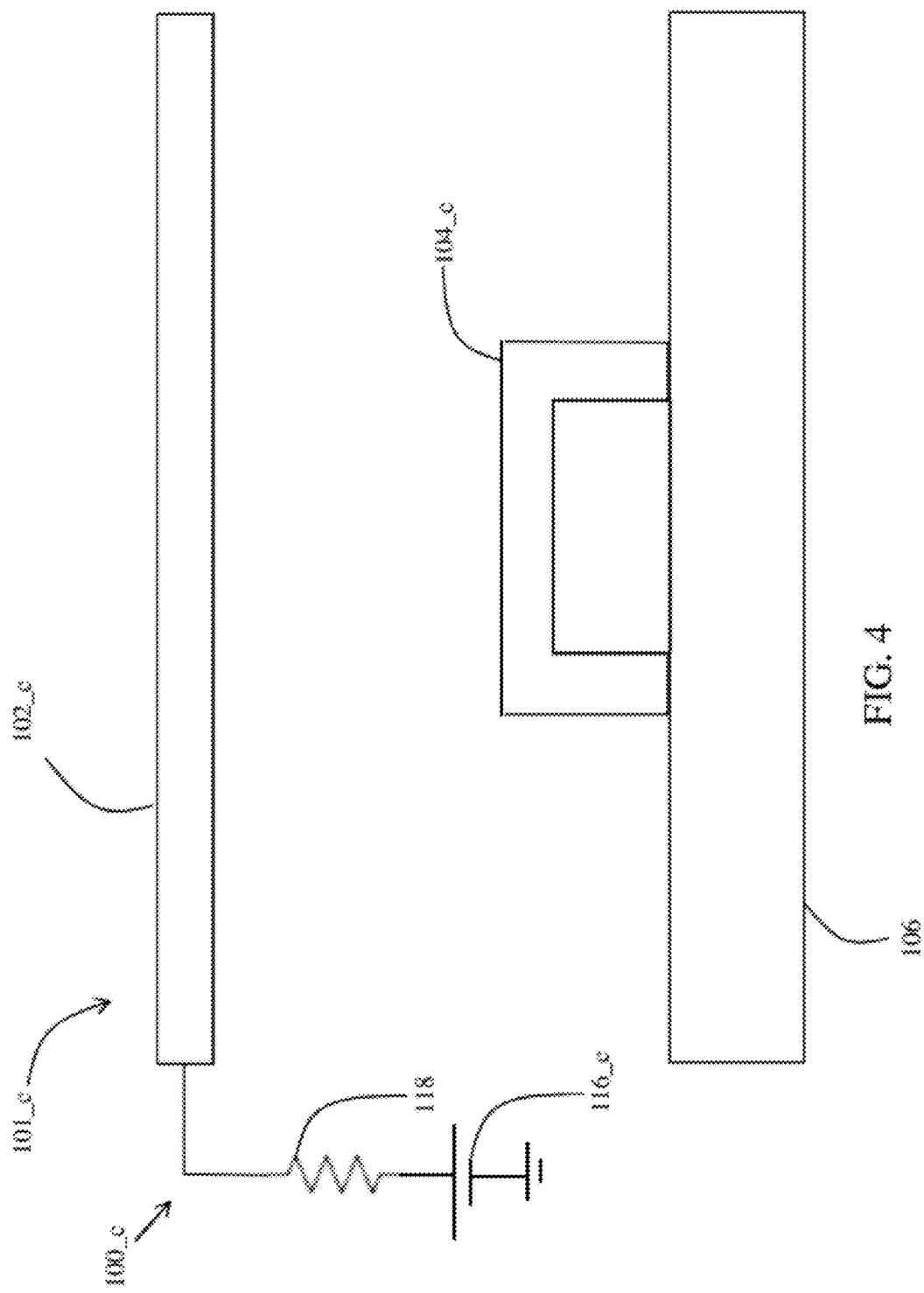
FIG. 4 is a schematic view of a typical RF-MEMS CS driven with the novel approach, according to the present disclosure, depicted in an inactivated state.

Referring to FIG. 4, a schematic view of the RF-MEMS CS system 100_c, according to the present disclosure using a resistive braking arrangement is depicted. The system includes an RF-MEMS CS device 101_c, a voltage source 116_c, and a resistor 118. The device 101_c is coupled to the voltage source 116_c and the resistor 118. It is appreciated that the voltage source 116_c can be a switched supply (i.e., on and off) or a linear supply (i.e., capable of providing voltages according to a predetermined range). It is also appreciated that the resistor 118 is intended to represent an impedance (i.e., including a real component and an imaginary component).

The device 101_c is defined by a moveable electrode 102_c, a dielectric layer 104_c, and a substrate 106. The moveable electrode 102_c and the dielectric layer 104_c are separated by a gap, e.g., an airgap. The device 101_c is depicted in an inactivated state; therefore the gap is the largest.

Reducing $v_{impact}$ is accomplished by inserting a resistor 118 in series with the voltage source 116 (see FIG. 1). Initially, there will be large $t=0^+$ transient (few ns) to charge the capacitor during which the charging current $I$ can be significant. Once this $t=0^+$ transient is over and the upper electrode begins to move, $I$ is relatively small at the early stages of pull-in such that $V_0 \sim V$ and the moveable electrode 102 (or 102_b, 102_c) pulls in. For t close to $t_{PI}$, I increases rapidly, causing significant remote resistive dissipation across the resistor 118. As a result, the point D moves down closer to $P_2$ in FIG. 5(a), with corresponding reduction in $E_d$ and $v_{impact}$. This self-retardation does not require any complex external circuitry to shape $V_c$, but achieves the same effect dynamically through the negative feedback introduced by the resistor 118 in the scheme.

Figures 6A, 6B, 6C, 6D:
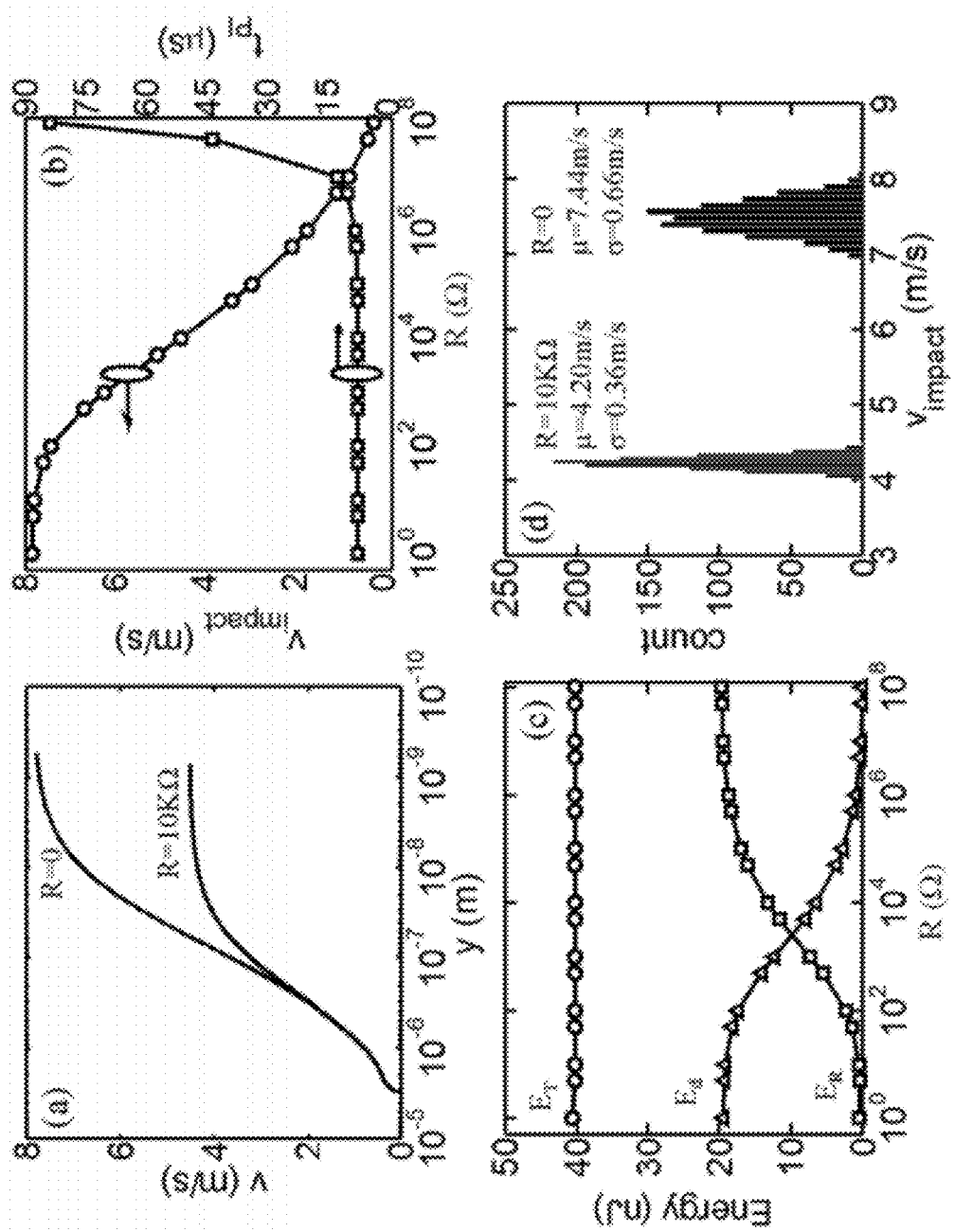
FIGS. 6($a$)-6($d$) are graphs of (a) Velocity (v) as a function of displacement (y) during an activation cycle, according to the present disclosure; (b) $v_{impact}$ and $t_{PI}$ as a function of resistance (R); (c) Energy as a function of resistance (R); and (d) distribution of $v_{impact}$ due to process variation for R=0 and R=10 kΩ, for activation of the RF-MEMS CS according to the present disclosure.

Dynamic resistive braking by solving Eqs. (1)-(3) numerically for a typical/practical MEMS switch is described (i.e., based on the RF-MEMS CS system 100 depicted in FIG. 1). Referring to FIG. 6(a) shows u as a function of y during pull-in with (i) the resistor 118 having a value of 0Ω; and (ii) the resistor 118 having a value of 10 kΩ. In both the cases, the moveable electrode 102 (or 102_b or 102_c) lands on the dielectric in almost same $t_{PI}$ (see FIG. 6(b)), however, with the resistor 118 having a value of 10 kΩ, $v_{impact}$ is reduced by almost 50%, so that only 25% of the kinetic energy is dissipated on the moveable electrode 102 (or 102_b or 102_c) and the dielectric layer 104 (or 104_b or 104_c) interface, while the rest 75% is dissipated in the remote resistance. Since resistive braking is only operative for a short duration close to $t \sim t_{PI}$ when v(t) is high (FIG. 5(b)), the resistive braking changes $v_{impact}$ without affecting $t_{PI}$ significantly. The upper limit of the resistance 118 is determined by the determination that if the resistance 118 is too high, the increase in $t_{PI}$ may be unacceptable, as I becomes large enough to reduce $v_c$ and retard the motion of the moveable electrode 102 (or 102_b or 102_c) throughout the pull-in process. For the illustrative problem, if the resistance 118<1 MΩ, large reduction in $v_{impact}$, without changing $t_{PI}$ significantly can be achieved (as depicted in FIG. 6(b)). FIG. 6(c) shows various components of energy dissipation as a function of the resistance 118. Total energy $$\left(E_T = C(0)V^2 = \frac{\epsilon_0\, \epsilon_r\, WL}{y_d}V^2\right)$$

is independent of the resistance 118 whereas energy dissipation at the dielectric surface $$\left(E_d = \frac{1}{2}mv_{impact}^2\right)$$

decreases with the resistance 118 and energy dissipated through the resistance 118 ($E_R = \int I^2 R\,dt$) increases with the resistance 118. It should be noted that $$E_R + E_a = E_T - \frac{1}{2}C(0)V^2 - \frac{1}{2}ky_a^2$$

by energy conservation) is independent of the resistance 118. This means that the energy dissipation at the surface of the dielectric layer 104 (or 104_b or 104_c) decreases because of increase in the (remote) resistive dissipation through the resistance 118 while keeping the energy supplied by the voltage source 116 (or 116_b or 116_c) unchanged.

Advantageously, resistive braking works well for an ensemble of switches in presence of process variation. FIG. 6(d) shows the distribution of impact velocity with 10% variation in the input parameters (L, W, $y_0$, $y_d$, etc.). Both, the mean (μ) and the standard deviation (σ) of the impact velocity are reduced significantly for the resistance 118=10 kΩ.

Dynamic Braking by 'Fractal' Capacitance

Figure 7:
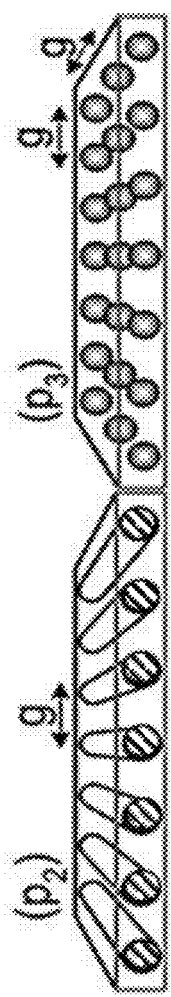
FIG. 7 is a perspective view of various embodiments of RF-MEMS CS, according to the present disclosure, wherein a moveable electrode and a substrate can be ($p_2$) arrays of cylinders encased in an insulator, and ($p_3$) arrays of spheres encased in an insulator.
Figure 8:
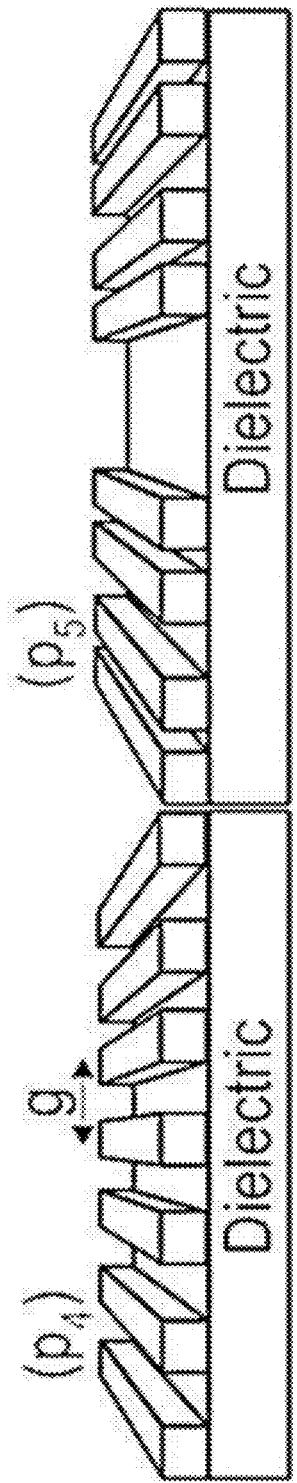
FIG. 8 is a collection of perspective views of various embodiments of RF-MEMS CS, according to the present disclosure, wherein the dielectric can be shaped to include ($p_4$) an array of linear slots; and ($p_5$) a fractal of linear slots.

An alternate scheme for reducing $v_{impact}$ is to pattern the moveable electrode 102 (or 102_b or 102_c) or the substrate 106 or the dielectric layer 104 (or 104_b or 104_c) as shown in FIG. 7 and FIG. 8 identified as (p2)-(p5). For example, the moveable electrode 102 (or 102_b or 102_c) and/or the substrate 106 can be an array of electrically connected cylinders, see FIG. 7, (p2) or spheres ($p_3$). Alternatively or in addition thereto, the dielectric layer 104 (or 104_b or 104_c) can be patterned to have an array/fractal of linear slots, see FIG. 8 ($p_4$) & ($p_5$). Patterns in FIG. 7 (i.e., (p2) & p3) can be fabricated using various techniques such as dielectrophoretic directed assembly, contact or transfer printing methods, or liquid-alloy filled microchannels. In general, however, top-down patterning of the dielectric and metal electrodes may be more manufacturable than bottom-up techniques described above.

Regardless the patterning, in the up-state of the moveable electrode 102 (or 102_b or 102_c) the fringing fields between the plates ensure that these patterned capacitors are indistinguishable from unpatterned parallel plate capacitor and therefore $C=Ay^{-1}$ before pull-in; $V_{PI}$ is therefore unaffected by patterning. As the moveable electrode 102 (or 102_b or 102_c) approaches the dielectric during pull-in, however, the individual field lines associated with the patterned array begins to separate rapidly from each other and elements of the array begins to behave as an isolated capacitors, with dramatic reduction in the effective area of the capacitor and hence the capacitance ($C=A(y)y^{-1}$). This dramatic reduction in the capacitance of a patterned capacitor causes electrostatic potential energy to reduce in magnitude, pushing point $P_2$ up closer to D (see FIG. 5(b)) resulting in reduced $E_d$ and $v_{impact}$.

Figures 9A, 9B, 9C, 9D:
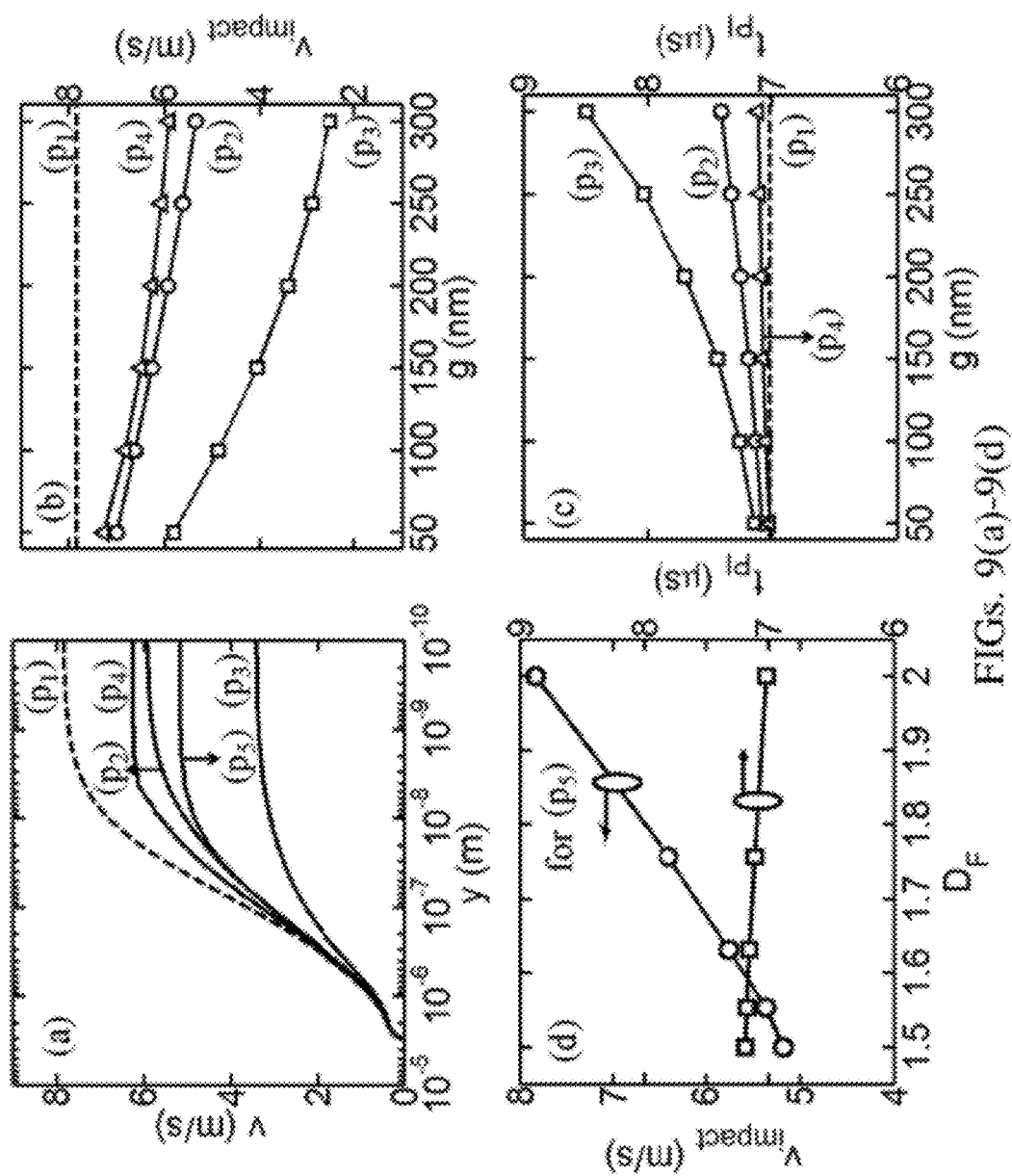
FIGS. 9($a$)-9($d$) are graphs of Velocity (v) as a function of displacement (y) during an activation cycle for the various embodiments depicted in FIGS. 7 and 8, FIG. 9($a$); $v_{impact}$ as a function of (g) between individual elements of the CS, FIG. 9($b$), $v_{impact}$ and $t_{PI}$ for fractal dielectric as a function of (g), FIG. 9($c$), and as a function of $D_F$, FIG. 9($d$). In each of the FIGS. 9($a$)-9($d$), p1 represents a planar electrode configuration found in the prior art.

The capacitance C(y) for the patterned structures shown in FIGS. 7 and 8 ((p2)-(p5)) can be calculated by solving the Poisson's equation i.e. $\nabla^2\phi(x, y, z)=0$ (φ being the potential at the point (x, y, z), where x and z are parallel to the electrode), numerically for each y and then be used in Eqs. (1)-(3). The results for the pull-in dynamics are summarized in FIGS. 9(a)-(d). FIG. 9(a) shows v as a function of y for patterned electrodes or dielectric. Reduction in $v_{impact}$ is maximum for an array of spheres. FIGS. 9(b)-(c) show and $v_{impact}$ and $t_{PI}$ as a function of separation (g) between individual elements (see FIGS. 7 and 8) of the patterned electrode or dielectric. As g increases, $v_{impact}$ decreases at the cost of increased $t_{PI}$, FIG. 9(d) shows $v_{impact}$ and $t_{PI}$ as a function of fractal dimension ($D_F$) of patterned dielectric of FIG. 8(p5). As $D_F$ of the patterned dielectric increases, the dielectric begins to resemble a classical parallel plate MEMS switch and the advantages of patterning are rapidly diminished.

It should be appreciated that while the above disclosure has dealt primarily with RF MEMS CS, the soft landing arrangements can be applied to any switches that require two electrodes to move with respect to each other and make contact in order to switch. A large selection of such switches (e.g., MEMS type switches) is seen in applications outside of RF circuits. In any such application, employing the resistive braking and/or the dynamic braking as described above can be used to slow the relative movement and thereby cushion the contact as one electrode comes into contact with another. In general, the above-described arrangements are applicable to systems (e.g., MEMS ohmic switches, nanoelectromechanical system relays) involving contacting of two electrodes actuated by a voltage source. While, only one moveable electrode is shown in the figures in this application where the movement of the moveable electrode is with respect to a fixed dielectric layer, it is well within the scope of this disclosure to also include cases where i) there is a moveable electrode that is moveable with respect to a fixed electrode by application of a voltage, and ii) two moveable electrodes that are moveable with respect to each other by application of voltages to each of the two moveable electrodes.

Those skilled in the art will recognize that numerous modifications can be made to the specific implementations described above. Therefore, the following claims are not to be limited to the specific embodiments illustrated and described above. The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

The invention claimed is:

1. A microelectromechanical system (MEMS)-based electrical switch system, comprising:
   at least one electrical switch, comprising:
      a moveable electrode,
      a dielectric layer disposed adjacent the moveable electrode on a first side of the dielectric layer and spaced apart from the moveable electrode when the switch is in an inactivated position and in contact with the moveable electrode when the switch is in an activated position, and
      a substrate attached to the dielectric layer on a second side opposite to the first side;
   at least one voltage source coupled to the switch; and
   at least one resistive element positioned in series between the switch and the voltage source,
   the resistive element is configured to brake movement of the moveable electrode prior to coming in contact with the dielectric layer when the voltage source causes the switch to be switched between the inactivated state and the activated state;
   the moveable electrode is formed from a plurality of electrically connected structures that are spaced from one another and held together by an insulator, the electrically connected structures selected from the group consisting of:
   a) cylindrical structures; and
   b) spherical structures arranged in strips.

2. The system of claim 1, the resistive element is a resistor.

3. The system of claim 1, the resistive element is capacitor.

4. The system of claim 1, the resistive element includes a resistor and a capacitor.

5. A microelectromechanical system (MEMS)-based electrical switch system, comprising:
   at least one electrical switch, comprising:
      a moveable electrode,
      a dielectric layer disposed adjacent the moveable electrode on a first side of the dielectric layer and spaced apart from the moveable electrode when the switch is in an inactivated position and in contact with the moveable electrode when the switch is in an activated position, and
      a substrate attached to the dielectric layer on a second side opposite to the first side;
   at least one voltage source coupled to the switch; and
   at least one resistive element positioned in series between the switch and the voltage source,
   the resistive element is configured to brake movement of the moveable electrode prior to coming in contact with the dielectric layer when the voltage source causes the switch to be switched between the inactivated state and the activated state;
   the substrate is formed from a plurality of electrically connected structures that are spaced from one another and held together by an insulator, the electrically connected structures selected from the group consisting of:
   a) cylindrical structures; and
   b) spherical structures arranged in strips.

6. A microelectromechanical system (MEMS)-based electrical switch, comprising:
   a moveable electrode;
   a dielectric layer disposed adjacent the moveable electrode on a first side of the dielectric layer and spaced apart from the moveable electrode when the moveable electrode is in an inactivated position and in contact with the moveable electrode when the moveable electrode is in an activated position; and
   a substrate attached to the dielectric layer on a second side opposite to the first side,
   the moveable electrode is configured to brake prior to coming in contact with the dielectric layer when the moveable electrode is switched between the inactivated state and the activated state;
   the moveable electrode is formed from a plurality of electrically connected structures that are spaced from one another and held together by an insulator, the electrically connected structures selected from the group consisting of:
   a) cylindrical structures; and
   b) spherical structures arranged in strips.

7. A microelectromechanical system (MEMS)-based electrical switch, comprising:
   a moveable electrode;
   a dielectric layer disposed adjacent the moveable electrode on a first side of the dielectric layer and spaced apart from the moveable electrode when the moveable electrode is in an inactivated position and in contact with the moveable electrode when the moveable electrode is in an activated position; and
   a substrate attached to the dielectric layer on a second side opposite to the first side
   the moveable electrode is configured to brake prior to coming in contact with the dielectric layer when the moveable electrode is switched between the inactivated state and the activated state;
   the substrate is formed from a plurality of electrically connected structures that are spaced from one another and held together by an insulator, the electrically connected structures selected from the group consisting of:
   a) cylindrical structures; and
   b) spherical structures arranged in strips.

8. The system of claim 5, the resistive element is a resistor.

9. The system of claim 5, the resistive element is capacitor.

10. The system of claim 5, the resistive element includes a resistor and a capacitor.

* * * * *